(12) United States Patent
Johansson et al.

(10) Patent No.: US 6,486,410 B1
(45) Date of Patent: Nov. 26, 2002

(54) FLEXIBLE PRINTED CIRCUIT BOARD WITH RESILIENT TABS AND METHOD OF MOUNTING COMPONENTS THEREON

(75) Inventors: Stefan Johansson, Uppsala (SE); Staffan Karlsson, Uppsala (SE)

(73) Assignee: Piezomotors Uppsala AB, Uppsala (SE)

( * ) Notice: Subject to any disclaimer, the term of this patent is extended or adjusted under 35 U.S.C. 154(b) by 0 days.

(21) Appl. No.: 09/889,792

(22) PCT Filed: Jan. 14, 2000

(86) PCT No.: PCT/SE00/00064
§ 371 (c)(1),
(2), (4) Date: Jul. 20, 2001

(87) PCT Pub. No.: WO00/44211
PCT Pub. Date: Jul. 27, 2000

(30) Foreign Application Priority Data

Jan. 20, 1999 (SE) ................................................. 9900163

(51) Int. Cl.⁷ .............................. H05K 1/16; H05K 1/00
(52) U.S. Cl. ......................... 174/254; 439/73; 439/77; 439/67; 361/774; 361/749; 361/809; 174/260
(58) Field of Search .................................. 174/254, 260, 174/255; 361/749, 750, 751, 767, 769, 789, 810, 774, 809; 439/77, 67, 73

(56) References Cited

U.S. PATENT DOCUMENTS

| | | | |
|---|---|---|---|
| 3,528,173 A | * | 9/1970 | Gall |
| 4,151,579 A | | 4/1979 | Stark |
| 4,295,184 A | * | 10/1981 | Roberts |
| 4,970,624 A | * | 11/1990 | Avneson |
| 5,049,089 A | | 9/1991 | Koenig |

FOREIGN PATENT DOCUMENTS

| | | |
|---|---|---|
| DE | 35 05 129 A1 | 8/1986 |
| DE | 196 14 879 C1 | 7/1997 |
| EP | 0 256 581 A1 | 7/1987 |
| EP | 0 649 272 A1 | 4/1995 |

* cited by examiner

*Primary Examiner*—Kamand Cuneo
(74) *Attorney, Agent, or Firm*—Young & Thompson

(57) ABSTRACT

The present invention uses the resilient behaviour of a flexible printed circuit board (10), both to mechanically clamp the components (20) in a permanent manner and to achieve good electrical contacts (24) between conducting parts (12) of the flexible circuit board (10) and the components (20). By cutting the flexible printed circuit board in such a manner that small tab-like, resilient members (12,16) are formed, the forces caused by elastically deformed resilient members (12,16) are usable both for mechanically fixing the components (20) and for causing an electrical contact (24). By choosing appropriate sizes of the resilient members (12,16), the relative strength of the spring force is increased, which even will be large enough to cause a plastic deformation of the material in the contact points (24) between the conducting resilient members (12) and the component contact members (22). In such a manner, soldering or gluing may be totally omitted.

30 Claims, 3 Drawing Sheets

FLEXIBLE PRINTED CIRCUIT BOARD WITH RESILIENT TABS AND METHOD OF MOUNTING COMPONENTS THEREON

TECHNICAL FIELD

The present invention generally relates to flexible printed circuit boards, and in particular to the mounting of components thereto.

BACKGROUND

For mounting electrical and other components to a flexible printed circuit boards according to prior art, the components are positioned at the appropriate locations and subsequently fastened by gluing or soldering. There is often a problem to maintain the components at the appropriate positions with a sufficient precision, during the gluing or soldering process.

The European patent application EP 0 256 581 A1 discloses a method for fixation of electric components at a flexible printed circuit board, which is intended to hold the component during the soldering or gluing process. This method is based on that tabs are formed in the flexible printed circuit board, which tabs extend into an opening in the flexible printed circuit board, large enough to allow the component to pass through. By introducing components from the back side of the board, the tabs are bent and applies a force onto surfaces of the component which are perpendicular to the board surface. The tabs clamp the component between each other and by prohibit the component to move back again, the component is fixed. The method is intended to be ended by a soldering or gluing process, which finally fastens the component. The tabs may also be covered with a conducting layer, which provides a possibility to achieve electrical contact by soldering or gluing with a conducting adhesive.

Most electric circuit mounting processes of prior art relies on soldering or gluing for achieving a good electrical contact and for maintaining the component mechanically in a fixed position. However, gluing or soldering processes are not always desired, in particular for very small components. There is always a risk for not achieving a sufficient reliable joint or to achieve a shortening between different electrical parts. Furthermore, the soldering and gluing occupies a separate production step, which increases the mounting times. If a component is found to be defect after mounting, there are also large problems to replace the defect component with a new one. When soldering, the joint may be reheated to melt the soldering, but for gluing, the normal procedure is to reject the total board.

Many printed circuit boards also uses separate assembling structures to hold the different components. The European patent application EP 0 649 272 A1 discloses a flexible fastening member which is used to reduce stress caused by differing temperature coefficients for the board and the components. However, a fastening member of that type increases the complexity of the assembling procedure considerably.

There is also a general problem in finding cheap and simple solutions on contacting members. One solution is disclosed in the U.S. Pat. No. 5,049,089. In this document a method is described, which uses a portion of a flexible printed circuit board provided with electrical leads, which portion is bent and stuck into opening in another circuit board. The elastic force keeps the portion in position when applying the soldering material.

The particular solution, mentioned in EP 0 256 581, has the further problems of mechanically holding the component only by the tabs, why the heat exchange with the printed circuit board is very low, with overheating as a problem. Furthermore, the total mass of the component is mechanically fixed only by the limited tabs, which easily may cause fractures in the soldering.

SUMMARY OF THE INVENTION

The overall object of the present invention is to achieve a method of electrical circuit board assembling, which may omit the soldering or gluing step. Another object of the present invention is to reduce the number of separate parts used for assembling and electrically connecting. A further object of the present invention is to mount the components at the printed circuit board in a removable manner, for simplifying replacement of components or function as an electric connector.

The above objects are provided by an arrangement and mounting method according to the enclosed claims. In short terms, the present invention can be described as using the resilient behaviour of the flexible printed circuit board both to mechanically clamp the components in a permanent manner and to achieve good electrical contacts between conducting parts of the flexible circuit boards and the components. By cutting the flexible printed circuit board in such a manner that small tab-like, resilient members are formed, the forces caused by elastically deformed resilient members are usable both for mechanically fixing the components and for causing an electrical contact. By choosing appropriate sizes of the resilient members, the relative strength of the spring force is increased, which even will be large enough to cause a plastic deformation of the material in the contact points between the conducting resilient members and the component contact members. In such a manner, soldering or gluing may be totally omitted.

BRIEF DESCRIPTION OF THE DRAWINGS

The invention, together with further objects and advantages thereof, may best be understood by making reference to the following description taken together with the accompanying drawings, in which.

DETAILED DESCRIPTION

Most electrical components used today in modern electronics have a relatively small size. The development of components tends to continue this size reduction. When the size of an electrical system is reduced, the influence of the mass of the components decreases with the cube of the length measure. At the same time, the area upon which the components are assembled only decreases with the square of the same length measure, and many mounting structures, exhibiting mainly one-dimensional shapes, decreases only proportionally with the same length measure. Since the mounting area and mounting structures normally are responsible for the strength of the mounting, a reduction in size proportionally to a length measure normally results in a relatively stronger fastening. Thus, in many systems of small components according to prior art, the means for holding the components and for creating the electrical contact are normally exaggerated.

Furthermore, when considering a resilient material, a reduced size may change the behaviour of the resilient material. A resilient material, which in a macroscopic situation has to be considered fluttering, will in a situation where the area dimension is considerably smaller, appear much stiffer. Such behaviours are readily understood from the theory of material strength. A beam with a certain length will increase its elastic force action for a certain deviation as the inverse of the beam length. A short beam win therefore appear stiffer than a long beam of equal cross-sectional area.

One of the main features of the present invention is the idea of using resilient parts of the flexible printed circuit board, on which components are arranged, to supply the holding forces of the components and to provide enough force to achieve a good electric contact between conducting parts of the flexible printed circuit board and the components. The permanent fastening of the components is realisable without any gluing or soldering, just by using geometrical structures in the flexible printed circuit board itself. A number of resilient members of the flexible printed circuit board are used to hold the components in the final position against some counteracting means. At least one of the resilient members is also used to provide an electrical contact.

Figure 1:
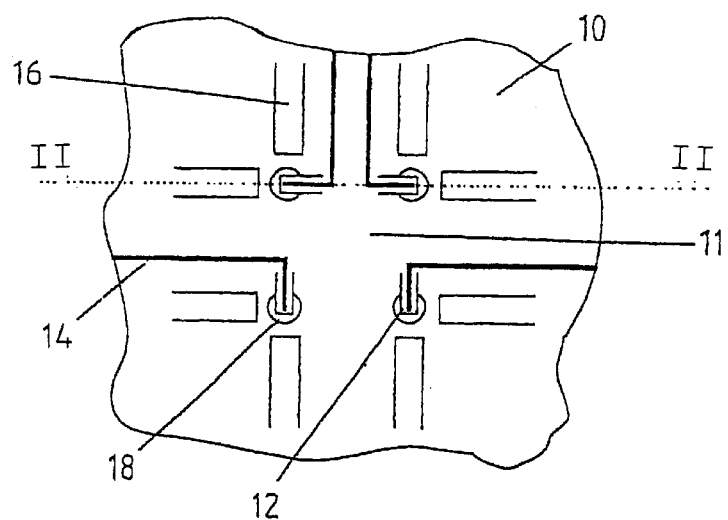
FIG. 1 is a schematic view of a part of a flexible printed circuit board usable in an arrangement according to the present invention.

FIG. 1 illustrates a portion of a flexible printed circuit board 10. The flexible printed circuit board 10 comprises an insulating material, and one or several layers of conductor structures 14. In the flexible printed circuit board 10, a number of geometrical structures are cut-out In the embodiment, shown in FIG. 1, eight resilient members 16, here in the shape of tabs, are available around a substantially square centre area 11. Two tabs are positioned at each of the sides of the square 11. In each of the square corners, a hole 18 is provided. A conducting tab 12, constituting a part of the conductor structures 14, extends into the hole 18. This is the configuration of the original flexible printed circuit board 10 prior to the mounting of components.

Figure 2:
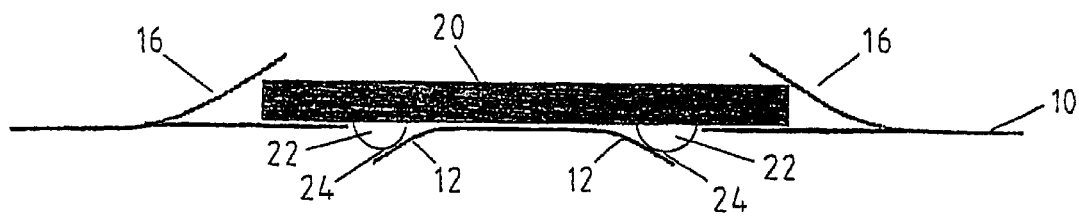
FIG. 2 is a cross-sectional view of the flexible printed circuit board of FIG. 1 taken along the line II—II, with a component mounted thereon, according to a preferred embodiment of the present invention.

FIG. 2 is a cross-sectional view of the flexible printed circuit board according to FIG. 1, taken along the line II—II, with a component 20 mounted at the flexible printed circuit board according to a preferred embodiment of the present invention. The component 20 is provided with four contact members 22, of which two are shown in the figure. The contact members 22 are in the form of bumps of gold or PbSn, a conventional way today to provide contact members 22 on different components. The component 20 is placed on top of the centre area 11, with the contact members 22 protruding through the holes 18. The holes 18 have preferably a size which substantially agrees with the base diameter of the bumps 22, thereby providing a structural aligning action to the component 20. The relative positions of the holes 18, and their dimensions, are the tools used for positioning the component 20 at the requested position. Since the bumps 22 are rounded off, the original positioning of the component 20 is not critical, since the geometrical structure 18 in the flexible printed circuit board 10 and the geometrical structure 22 on the component 20 is self-aligning. The geometrical structures may not necessarily be of the above illustrated shape. Any geometrical shape, which may be engaged to each other may be used for this purpose.

The tabs 16 are bent upwards (as defined in FIG. 2), the component 20 is positioned at the centre area portion 11. The bumps 22 of the component 20 protrudes trough the holes 18 and bends the conducting tabs 12 downwards (as defined in FIG. 2), providing an electrical contact between the conducting surface layer of the conducting tabs 12 and the bumps 22. The conducting tabs 12, which preferably are rather short, then applies a strong resilient force onto the component 20. The resilient force is applied substantially perpendicular to the surface of the flexible printed circuit board 10. Since the bumps 22 are substantially spherical, a rather limited contact point 24 is formed between each conducting tab 12 and bump 22. The resilient force of the tab 12 is preferably strong enough to cause a local plastic deformation of the material in the vicinity of the contact point 24. Such plastic deformation of the conducting material will break the surface layer of oxides and other insulating materials, which always are present at metal surfaces, and provide a good electrical contact, without the need of chemical cleaning and soldering. The surface of the conducting tab 12 and the electric component contact member 22 are preferably made of an inert and/or soft metal or alloy. An inert metal, such as gold, forms a very thin surface layer of oxides and impurities, which easily is broken by the contact force. A soft metal or alloy, such as PbSn, may indeed build up a thick but brittle oxide layer, but is instead more easily plastically deformed, whereby the brittle oxide layer is penetrated.

The conducting tabs 12 are applying a force onto the component 20, which acts to remove the component from the surface of the flexible printed circuit board 10. However, the tabs 16 are during the mounting procedure bent upwards, and afterwards the tabs 16 are allowed to spring back, until they come into contact with the upper surface of the component 20. The tabs 16 applies a resilient force onto the component 20 in a direction which counteracts the force provided by the conducting tabs 12, i.e. substantially perpendicular to the surface of the flexible printed circuit board 10. The tabs 16 thus acts as a counteracting means to prohibit the component from being displaced.

One important advantage with the present invention is that the component 20 is removably arranged onto the flexible printed circuit board 10. If a component 20 is defect or broken during the assembling process, this may not be detected until a final operation check is performed of the assembled board. The defect component may be identified by conventional test procedures, and is easily exchanged for a spare one. Since the mounting is provided by solely mechanical spring forces, no melting of any soldering joints have to be performed. The exchange is a simple mechanical procedure. This removable arrangement is well suited for testing purposes, e.g. when components have to be matched together. Furthermore, a final recycling disassembling is considerably facilitated by such a removable arrangement.

Another advantage, at least compared with EP 0 256 581 A1, is that the component 20 is hold with a substantial contact area 11 with undeformed parts of the flexible printed circuit board, and is thereby provided with a suitable heat exchange possibility. The flexible printed circuit board, may be provided with material at the centre area 11, which allows for an appropriate heat conduction.

The component 20 may be a pure electrical component, such as an integrated circuit, a resistor, a capacitor etc. It may also be an electromechanical, micromechanical, electrooptical, or any other combined type of component. The component may also be an electrical lead component, such as a connector means or the like. The ideas of the present invention applies best to small components, preferably in the order of 10 mm or less.

In the embodiment illustrated in FIG. 2, all resilient members, acting upwards in the figure, are used to provide an electrical contact. It is of course easily understood that also a subset of the resilient members could be used for this purpose. However, when having more than one electrical contact, it is important that the contacting properties of each contact point is independent of other contacting points. The present invention provides a contacting method, which accomplishes an individual treatment of each electrical contact, since each electrical contact has its own resilient member providing the contacting force. Small tolerance differences in the geometries of the contact members 22 will be compensated for by the individual spring forces.

Figure 3:
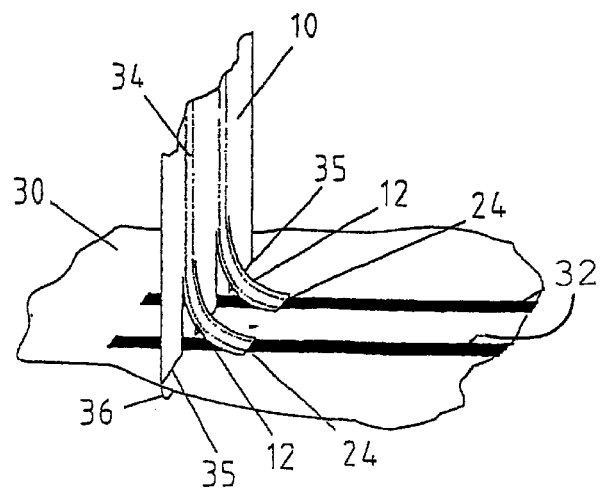
FIG. 3 is a schematic view of connector means according to the present invention.

FIG. 3 illustrates an electrical connector means 30 arrangement. A flexible printed circuit board 10 is provided with electrical leads 34, which ends in electrically conducting resilient tongues 12. The flexible printed circuit board 10 has at its end geometrical locking structures 36, in this example shaped as a semi-circle. A connector means 30, also made by a flexible printed circuit board also comprises electrically conducting surface coatings 32. Between and at each side of the surface coating areas 32, slits 35 are provided. By introducing the locking structures 36 through the slits 35, the flexible printed circuit board 10 and the connector means 30 will be physically interconnected and any displacing motion of the connector means 30 downwards (as defined in FIG. 3) is prohibited by the locking structure 36, which act as a counteracting means. The slits 35 are preferably weakly C- or S-shaped, whereby the introduction of the locking structures 36 is made easily by deforming the locking structure along the slit shape, while after the locking structure 36 has regained its original shape at the opposite side of the flexible printed circuit board 10, the locking structure 36 is caught. If several slits 35 are positioned close to each other, the shape may be straight, but the direction twisted as compared with the finally mounted locking structures 36. The tongues 12 are bent and provides an electrical contact between the flexible printed circuit board 10 and the connector means 30. Preferably, either the tongues 12 or the electrical leads 34 at the connector means 30 are provided with bumps, to accomplish a high contact pressure.

Figure 4:
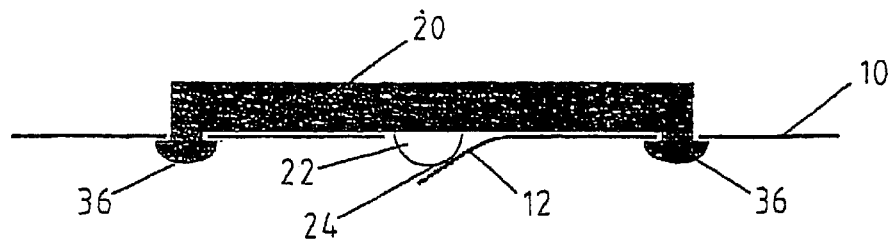
FIG. 4 is a cross-sectional view of an embodiment of the present invention using locking means.

FIG. 4 shows a cross-sectional view of a component 20, mounted at a flexible printed circuit board 10 according to another embodiment of the present invention. In this embodiment, the component 20 is provided with one contact bump 22, protruding through a hole in the flexible printed circuit board 10. A conducting resilient member 12 is deflected from the planar configuration and applies a spring force to the bump 22, thereby creating a electrically conducting contact point 24. In the embodiment of FIG. 4, the component 20 further comprises locking structures 36, of a similar geometrical type as used in FIG. 3. Half circles 36 are stuck through slits in the flexible printed circuit board 10 and acts as counteracting means. The counteracting means thus comprises a locking structure 36 connected to the flexible printed circuit board 10.

Other modifications of the same theme would for example be an external member supporting the components, for prohibiting its displacement due to the forces of the electrical contact means. In certain applications, gluing of the component 20 to the flexible printed circuit board 10 would also be possible, even if the removability in this case is lost.

Figure 5:
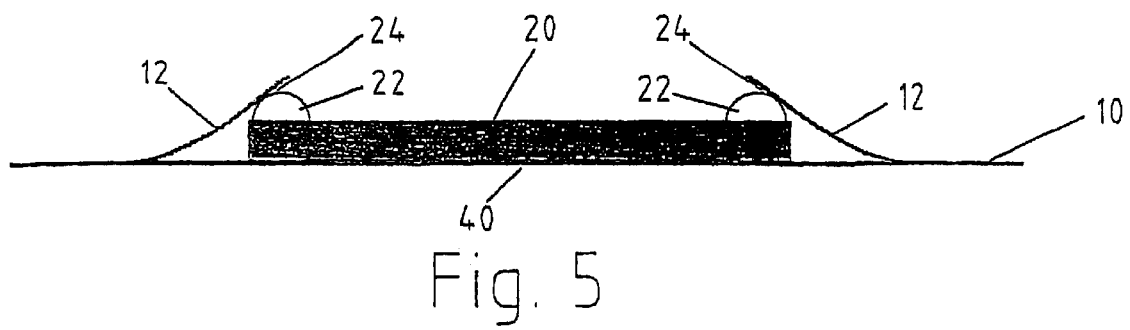
FIG. 5 is a cross-sectional view of an embodiment of the present invention, where the flexible printed circuit board itself is used as a counteracting means.

FIG. 5 shows a cross-sectional view of an alternative embodiment of the present invention. Here a component 20 provided with two contact bumps 22 at each end of the component is placed directly onto the flexible printed circuit board 10 with the contact bumps 22 directed upwards (as defined in the figure). Tabs 12, coated with a conducting surface layer at the bottom side are deflected upwards and apply contact forces onto the contact bumps 22. The tabs 12 create the electrical contact and clamp the component 20 against a portion 40 of the flexible printed circuit board 10. The counteracting means in this case is thus a portion of the flexible printed circuit board 10 itself.

Figure 6:
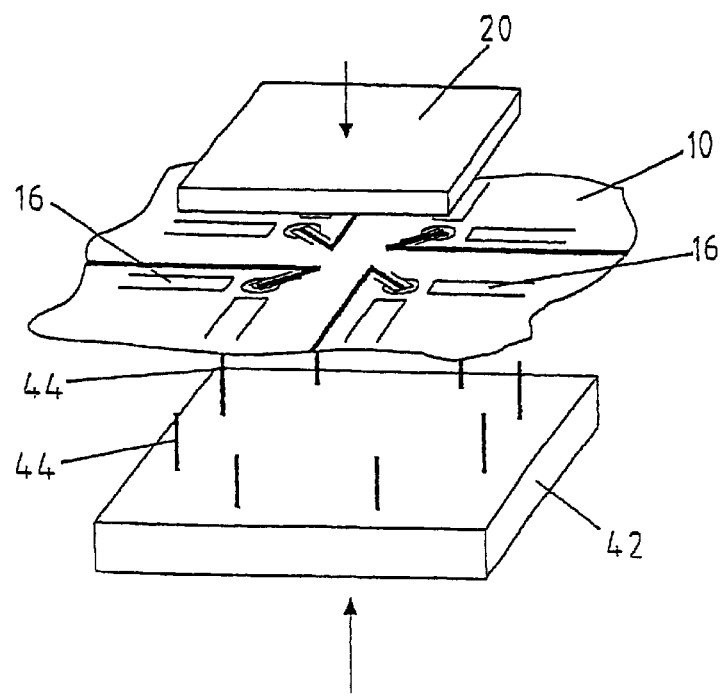
FIG. 6 is a schematic view illustrating a preferred method of assembling according to the present invention.

FIG. 6 illustrates a procedure for mounting components 20 on a flexible printed circuit board 10. A flexible printed circuit board 10 similar to the one shown in FIG. 1 is provided with necessary conducting layers and geometrical structures. A tool body 42 is provided with sprigs 44, at positions which agrees with the end of the tabs 16 at the flexible printed circuit board 10. The component 20 to be mounted fits in-between these sprigs 44. The tool body is moved from below (as defined in FIG. 6) towards the flexible printed circuit board 10 so that each sprig 44 hits the front end of one tab 16 each. The tabs 16 are deflected upwards, opening up a free area in-between the sprigs 44. The components 20 is inserted into this free area and placed against the flexible printed circuit board 10. The tool 42 is subsequently removed, allowing the tabs 16 to spring back and clamp the component 20 to the flexible printed circuit board 10.

Figure 7:
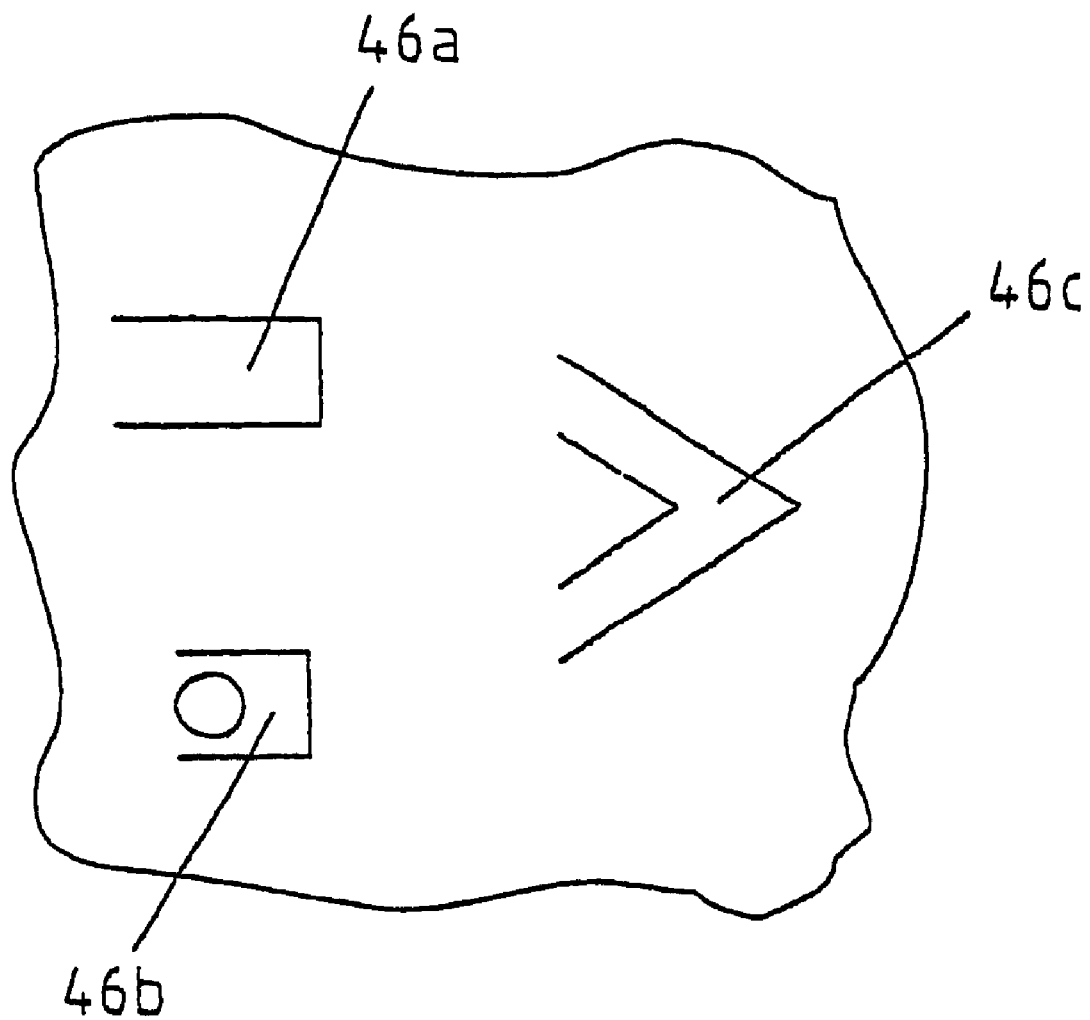
FIG. 7 illustrates a few examples of usable resilient member configurations.

In most of the above embodiments, the resilient members, used to accomplish the electrical contact or constituting parts of the counteracting means, are in the forms of tabs. The geometrical shapes are, however, not critical, and various configurations are possible, which will have advantages and disadvantages in different applications. FIG. 7 illustrates a few possible examples of resilient members, which are useful in the present invention. A traditional substantially rectangularly shaped tab 46a is perhaps the most probable choice for most applications. The elastic strength of the resilient member may also be modified by the geometrical structure, as for e.g. by introducing a hole in a tab 46b. The generally V-shaped resilient member 46c may be another alternative.

It will be understood by those skilled in the art that various modifications and changes may be made to the present invention without departure from the scope thereof, which is defined by the appended claims.

What is claimed is:

1. A flexible printed circuit board arrangement, comprising a flexible printed circuit board, having a number of first resilient members formed therein;

at least one component, mounted on a main surface of said flexible printed circuit board and clamped by said first resilient members, said component having a contact member for electrical connection, said first resilient members being arranged to apply a resilient force directly onto said component in a first direction, substantially perpendicular to the main surface of said flexible printed circuit board;

counteracting means for prohibiting displacement of said component in said first direction;

one of said first resilient members having an electrically conducting surface at a side facing said component;

said conducting first resilient member being arranged to apply a resilient force onto said contact member of said component, for establishing electrical contact directly between said electrically conducting surface and said contact member.

2. The flexible printed circuit board arrangement according to claim 1, wherein said component is an electrical, electromechanical, micromechanical, electrooptical and/or electrical connector component.

3. The flexible printed circuit board arrangement according to claim 1, wherein said resilient force between said contact member and conducting first resilient member is strong enough to cause a local plastic material deformation of said electrically conducting surface and/or said contact member.

4. The flexible printed circuit board arrangement according to claim 3, wherein said counteracting means comprises an adhesive joint.

5. The flexible printed circuit board arrangement according to claim 1, wherein said component is removably arranged.

6. The flexible printed circuit board arrangement according to claim 5, wherein said counteracting means comprises a locking structure connected to said flexible printed circuit board.

7. The flexible printed circuit board arrangement according to claim 6, wherein said counteracting means comprises a number of second resilient members formed in said flexible printed circuit board.

8. The flexible printed circuit board arrangement according to claim 5, wherein said counteracting means comprises an external means.

9. The flexible printed circuit board arrangement according to claim 1, wherein said contact member is formed as a bump.

10. The flexible printed circuit board arrangement according to claim 1, wherein said conducting surface and said contact member is formed by an inert and/or soft metal or alloy.

11. The flexible printed circuit board arrangement according to claim 1, comprising a plurality of said conducting first resilient members, each one arranged to apply a resilient force onto one separate said contact member of said component, for establishing electrical contact, whereby the resilient action of each conducting first resilient member is independent of each other.

12. The flexible printed circuit board arrangement according to claim 1, wherein a portion of said component has a first geometrical structure, and said flexible printed circuit board has a second geometrical structure, which is engageable with said first geometrical structure, for defining a position of said component at said flexible printed circuit board.

13. The flexible printed circuit board arrangement according to claim 12, wherein said first geometrical structure is a hole and said second geometrical structure is a bump.

14. The flexible printed circuit board arrangement according to claim 1, wherein said component has a substantial contact area with undeformed portions of said flexible printed circuit board.

15. The flexible printed circuit board arrangement according to claim 1, wherein said component is smaller than 10 mm.

16. A method for mounting components on a flexible printed circuit board, comprising the steps of:

providing a flexible printed circuit board;

forming a number of first resilient members in said flexible printed circuit board;

providing at least one component on a main surface of said flexible printed circuit board;

clamping said component by said first resilient members;

arranging said first resilient members to apply a resilient force directly onto said component in a first direction, substantially perpendicular to the main surface of said flexible printed circuit board;

providing a counteracting force to prohibit displacement of said component in said first direction;

providing one of said first resilient members with an electrically conducting surface at a side facing said component; and establishing direct electrical contact between said conducting first resilient member and said component by arranging said electrically conducting surface to apply a resilient force directly onto a contact member of said component.

17. The method for mounting components according to claim 16, further comprising the step of plastically deforming material of said electrically conducting surface and/or said contact member at a contact point between said conducting first resilient member and said component.

18. The method for mounting components according to claim 16, wherein said providing a counteracting force comprises locking of geometrical structures of said component to said flexible printed circuit board.

19. The method for mounting components according to claim 16, wherein said providing a counteracting force comprises positioning of said component between said first resilient members and the surface of said flexible printed circuit board.

20. The method for mounting components according to claim 16, wherein said providing a counteracting force comprises providing second resilient members in said flexible printed circuit board and positioning said component between said first resilient members and said second resilient members.

21. The method for mounting components according to claim 16, wherein said providing a counteracting force comprises positioning an external force against a side of said component opposite said first resilient member.

22. The method for mounting components according to claim 16, wherein said providing a counteracting force comprises gluing or soldering said electrical contact to an undeflected portion of said flexible printed circuit board.

23. The method for mounting components according to claim 16, further comprising the steps of:

providing said component with a first geometrical structure;

providing said flexible printed circuit board with a second geometrical structure; and fitting said first geometrical structure into engagement with said second geometrical structure.

24. The method for mounting components according to claim 16, further comprising the step of clamping said component against an undeformed portion of said flexible printed circuit board.

25. The method for mounting components according to claim 24, wherein said clamping step comprises the steps of:

deforming said first resilient members in a direction opposite said first direction;

positioning said component between said deformed first resilient members; and releasing said first resilient members.

26. The method for mounting components according to claim 25, wherein said deforming said first resilient members comprises the step of pushing tip members against said first resilient members from the side of said flexible printed circuit board opposite to said electrical contact.

27. A circuit board, comprising:

a flexible substrate having a planar first surface;

plural first tabs, each of which is a part of said first surface of said substrate and is resiliently deformable away from a plane of said first surface; and a component having a first side on said first surface and that is clamped by said plural first tabs, said plural first tabs being resiliently deformed away from the plane of said first surface and contacting a second side of said component opposite said first side, said plural first tabs urging said component in a first direction perpendicular to said plane of said first surface and onto said first surface.

28. The circuit board of claim 27, wherein said component has a projecting electrical contact on said first side and wherein said first surface of said substrate has a second resiliently deformable tab that is deformed out of the plane of the first surface by said projecting electrical contact.

29. The circuit board of claim 27 wherein said component has a projecting electrical contact on said second side and wherein one of said first tabs contacts said projecting electrical contact.

30. A flexible printed circuit board arrangement, comprising a flexible printed circuit board having a number of first resilient members formed therein;

at least one component removably clamped by said first resilient members, said component having a contact member for electrical connection, said first resilient members being arranged to apply a resilient force onto said component in a first direction, substantially perpendicular to a surface of said flexible printed circuit board;

counteracting means for prohibiting displacement of said component in said first direction, said counteracting means being a portion of said flexible printed circuit board;

one of said first resilient members having an electrically conducting surface at a side facing said component;

said conducting first resilient member being arranged to apply a resilient force onto said contact member of said component, for establishing electrical contact between said electrically conducting surface and said contact member.

\* \* \* \* \*